United States Patent
Hirose et al.

(10) Patent No.: US 11,195,986 B2
(45) Date of Patent: Dec. 7, 2021

(54) PIEZOELECTRIC COMPOSITION AND PIEZOELECTRIC ELEMENT

(71) Applicant: TDK CORPORATION, Tokyo (JP)

(72) Inventors: Yuiko Hirose, Tokyo (JP); Hiroki Katoh, Tokyo (JP); Masakazu Hirose, Tokyo (JP)

(73) Assignee: TDK CORPORATION, Tokyo (JP)

( * ) Notice: Subject to any disclaimer, the term of this patent is extended or adjusted under 35 U.S.C. 154(b) by 216 days.

(21) Appl. No.: 16/496,987

(22) PCT Filed: Mar. 20, 2018

(86) PCT No.: PCT/JP2018/011038
§ 371 (c)(1),
(2) Date: Sep. 24, 2019

(87) PCT Pub. No.: WO2018/180771
PCT Pub. Date: Oct. 4, 2018

(65) Prior Publication Data
US 2020/0313072 A1    Oct. 1, 2020

(30) Foreign Application Priority Data

Mar. 28, 2017   (JP) .............................. JP2017-062376

(51) Int. Cl.
*H01L 41/187*    (2006.01)
*C04B 35/495*    (2006.01)

(52) U.S. Cl.
CPC ........ *H01L 41/1873* (2013.01); *C04B 35/495* (2013.01); *C04B 2235/3255* (2013.01)

(58) Field of Classification Search
CPC ............... H01L 41/1873; C04B 35/495; C04B 2235/3255
See application file for complete search history.

(56) References Cited

FOREIGN PATENT DOCUMENTS

| | | |
|---|---|---|
| DE | 102006015042 A1 | 10/2007 |
| EP | 1796266 B1 | 2/2016 |
| JP | 2015-071506 A | 4/2015 |

OTHER PUBLICATIONS

Lee et al, "Structural and Electrical Properties of KNbO3 thin films grown on Pt/Ti/SiO2/Si Substrate using RF Magnetron Sputtering Method", Acta Materialia 112 (2016), pp. 53-58, Apr. 15, 2016.*
Joung et al, "Structural Variation of Hydrothermally Synthesized KNbO3 Nanowires", J. Appl. Phys. 111, 114314 (2012), Jun. 14, 2012, pp. 114314-1 to 114314-5.*
Sato et al. "Excess Potassium and Microstructure Control for Producing Dense KNbO3 Ceramics". Transactions of the Materials Research Society of Japan, vol. 37, pp. 65-68, 2012.

(Continued)

*Primary Examiner* — C Melissa Koslow
(74) *Attorney, Agent, or Firm* — Oliff PLC

(57) ABSTRACT

A piezoelectric composition having a complex oxide including potassium and niobium, in which the complex oxide has a first phase represented by a compositional formula $KNbO_3$, and one or two phases selected from a second phase represented by a compositional formula $K_4Nb_6O_{17}$ and a third phase represented by a compositional formula $KNb_3O_8$.

12 Claims, 3 Drawing Sheets

(56) References Cited

OTHER PUBLICATIONS

May 29, 2018 International Search Report issued in International Patent Application No. PCT/JP2018/011038.
Kosec, Marija et. al. "KNN-Based Piezoelectric Ceramics," Piezoelectric and Acoustic Materials for Transducer Applications Springer, Boston, MA, 2008, pp. 81-83.
Oct. 1, 2019 International Preliminary Report on Patentability issued in International Patent Application No. PCT/JP2018/011038.

* cited by examiner

PIEZOELECTRIC COMPOSITION AND PIEZOELECTRIC ELEMENT

BACKGROUND OF THE INVENTION

The present invention relates to a piezoelectric composition and a piezoelectric element having thereof.

The piezoelectric composition has, based on a spontaneous polarization due to bias of an electric charge in crystals, an effect (a piezoelectric effect) of generating electric charge on the surface due to receiving an external stress and an effect (a converse piezoelectric effect) of generating distortion due to an application of an external electric field.

Piezoelectric elements to which such piezoelectric compositions, capable of mutually converting mechanical displacement and electrical displacement, are applied are widely used in various fields. For example, an actuator as the piezoelectric element utilizing the converse piezoelectric effect, in relative to an applied voltage, can provide a minute displacement with a high precision and has a fast response speed. Therefore, the actuator can be used for driving e.g. an optical system component, an HDD head, an ink jet printer head, and a fuel injection valve.

It is also used as a sensor for reading a minute force or deformation amount using the piezoelectric effect. Furthermore, since the piezoelectric composition has an excellent responsiveness, resonance can also be caused by exciting the piezoelectric composition itself or an elastic body that is connected with the piezoelectric composition by applying an AC electric field. Therefore, it is also used as a piezoelectric transformer, an ultrasonic motor, etc.

In general, the piezoelectric composition is composed of a polycrystalline substance and is obtained by subjecting a poling processing to the fired ferroelectric composition. In the ferroelectric composition after firing, the direction of spontaneous polarization in each crystal is random. And the ferroelectric composition as a whole has no bias of the electric charge and does not exhibit the piezoelectric effect or the converse piezoelectric effect. Therefore, by applying a DC electric field higher than the coercive electric field to the fired ferroelectric composition, an operation called poling processing in which the direction of spontaneous polarization is aligned in a certain direction is performed. The ferroelectric composition after the poling processing can exhibit properties as the piezoelectric composition.

As the piezoelectric composition, a lead based piezoelectric composition composed of lead zirconate ($PbZrO_3$) and lead titanate ($PbTiO_3$) is frequently used. However, the lead-based piezoelectric composition contains about 60 to 70 wt % of lead oxide (PbO) having a low melting point, and lead oxide easily volatilizes during firing. Therefore, it is an extremely important task to obtain a lead-free piezoelectric composition from a viewpoint of environmental burden.

A research on a potassium niobate based compound has progressed as an eco-friendly lead-free piezoelectric composition. Among the lead-free piezoelectric compositions, it is known that this potassium niobate based compound has a relatively high Curie temperature and exhibits a large piezoelectric effect and a large converse piezoelectric effect. For example, the following Non-Patent Document 1 discloses a piezoelectric composition represented by a compositional formula $KNbO_3$.

Non-Patent Document 1: S. Sato, et al, "Excess Potassium and Microstructure Control for Producing Dense $KNbO_3$ Ceramics", Transactions of the Materials Research Society of Japan, 37 [1] 65-68 (2012)

BRIEF SUMMARY OF INVENTION

The above Non-Patent Document 1 describes that voids resulting from the volatilization of potassium at the time of firing is present in a sintered body of $KNbO_3$ produced using raw materials having stoichiometric ratio, and its density is lowered. Therefore, in the above Non-Patent Document 1, the density is improved by setting the composition to include potassium in excess of the stoichiometric ratio.

However, according to the method disclosed in the above Non-Patent Document 1, it is difficult to control the volatilization amount of potassium although the density is improved and is difficult to obtain the target composition. With a composition having an excess of potassium, there is a problem that potassium compounds remain in $KNbO_3$ after sintering and exhibits deliquescence.

On the other hand, when voids exist between crystal grains, there were problems that the resistivity of the piezoelectric composition is lowered, a poling processing cannot be performed sufficiently, and the piezoelectric properties of the piezoelectric composition cannot be exhibited to the maximum.

The invention has been made in view of such circumstances, and an object of the invention is to provide a piezoelectric composition having an excellent resistivity and a piezoelectric element including the piezoelectric composition.

BRIEF SUMMARY OF INVENTION

In order to achieve the above object, a piezoelectric composition of the invention is

[1] a piezoelectric composition having a complex oxide including potassium and niobium, in which the complex oxide has:

a first phase represented by a compositional formula $KNbO_3$; and one or two phases selected from a second phase represented by a compositional formula $K_4Nb_6O_{17}$ and a third phase represented by a compositional formula $KNb_3O_8$.

[2] The piezoelectric composition according to [1], in which x and y satisfy 0<x+y<10.0%, when a volume of the second phase and a volume of the third phase with respect to a volume of the first phase are x % and y %, respectively.

[3] The piezoelectric composition according to [2], in which x and y satisfy x>y.

[4] The piezoelectric composition according to any one of [1] to [3], in which the piezoelectric composition includes one or more selected from transition metal elements.

[5] A piezoelectric element including piezoelectric composition according to any one of [1] to [4].

It is possible to provide a piezoelectric composition having an excellent resistivity and a piezoelectric element including the piezoelectric composition, since the piezoelectric composition according to the invention has the above properties.

Hereinafter, the invention will be described in detail based on specific embodiments in the following order.
1. Piezoelectric element
   1.1 Piezoelectric composition
2. Method of producing piezoelectric element
3. Effects in the embodiment
4. Modified embodiments 1. Piezoelectric Element First, a piezoelectric element to which the piezoelectric composition according to the embodiment is applied will be described. The piezoelectric element is not particularly limited as long as it is an element to which the piezoelectric composition according to the embodiment can be applied. In the embodiment, a piezoelectric transformer, a thin film sensor, and a piezoelectric ultrasonic motor, etc. are exemplified.

Figure 1:
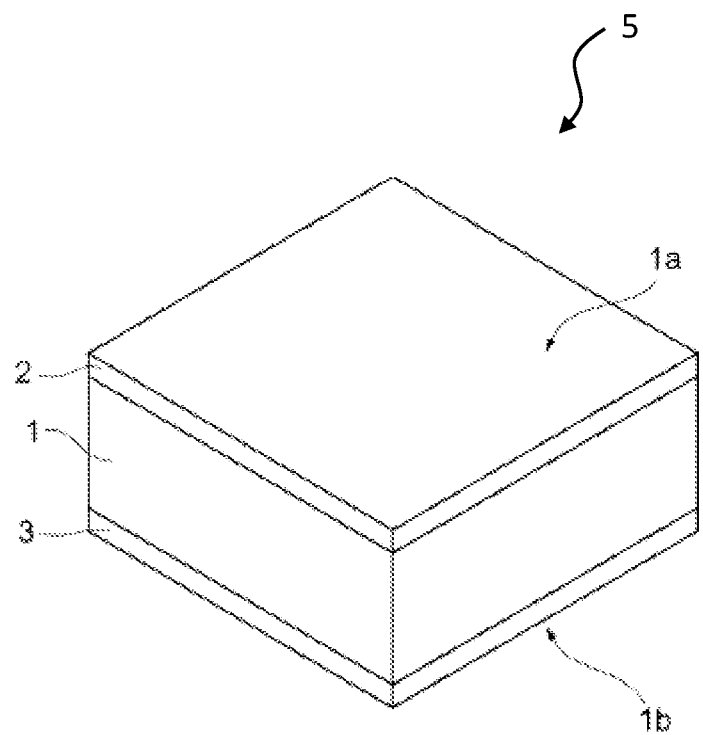
FIG. 1 is a schematic perspective view of an example of a piezoelectric element according to the embodiment.

The piezoelectric element 5 shown in FIG. 1 includes a plate-shaped piezoelectric part 1 and a pair of electrodes 2 and 3 respectively formed on a pair of opposing surfaces 1a and 1b, which are both main surfaces of the piezoelectric part 1. The piezoelectric part 1 includes the piezoelectric composition according to the embodiment. Details of the piezoelectric composition will be described later. The conductive material included in the electrodes 2, 3 is not particularly limited, and can be arbitrarily set according to desired properties, use, etc. Gold (Au), silver (Ag), palladium (Pd), etc. are exemplified in the embodiment.

Although the piezoelectric part 1 has a rectangular parallelepiped shape in FIG. 1, the shape of the piezoelectric part 1 is not particularly limited and can be arbitrarily set according to desired properties, use, etc. In addition, the size of the piezoelectric part 1 is not particularly limited, and can be arbitrarily set according to desired properties, use, etc.

The piezoelectric part 1 is poled in a predetermined direction. For example, in the piezoelectric element 5 shown in FIG. 1, it is polarized in the thickness direction of the piezoelectric part 1, namely, it is polarized in the direction in which the electrodes 2 and 3 are opposed. For instance, an external power supply (not shown) is electrically connected to the electrodes 2, 3, via wires or the like (not shown), and a predetermined voltage is applied to the piezoelectric part 1 via the electrodes 2, 3. When voltage is applied, an electrical displacement is converted into a mechanical displacement by the converse piezoelectric effect in the piezoelectric part 1, and the piezoelectric part 1 can laterally vibrate in a lateral direction.

(1.1 Piezoelectric Composition)

The piezoelectric composition according to the embodiment includes the complex oxide including potassium (K) and niobium (Nb) as a main component. According to the embodiment, the main component is 90 mol % or more with respect to 100 mol % of the piezoelectric composition.

The above complex oxide has a first phase represented by the compositional formula $KNbO_3$. $KNbO_3$ is a complex oxide having a perovskite structure. The perovskite structure is represented by a general formula $ABO_3$ and $BO_6$ oxygen octahedra including the B site element and oxygen constitute a three-dimensional network in which the apexes of the $BO_6$ oxygen octahedra are shared and the perovskite structure is formed by filling an A site element in the interstitial site of the network. The A site element is K and the B site element is Nb in the embodiment.

$KNbO_3$ is known that K, an alkali metal, is easy to evaporate at the time of firing the green compact. When K is volatilized, K decreases from the composition at the time of weighing. As a result, the amount of Nb with respect to the amount of K becomes excessive, an A/B ratio indicating the molar ratio of A site element with respect to B site element changes, and a balance of the composition is lost.

In this case, in order to maintain the balance of the composition of $KNbO_3$, a phase in which Nb amount is excessive than the ratio between K and Nb (K:Nb=1:1) in $KNbO_3$ may be formed out of the state of excess Nb relative to the composition of $KNbO_3$.

According to the embodiment, the complex oxide described above has a phase in which Nb is excessively included relative to the ratio of K and Nb in the first phase, in addition to the first phase described above. Specifically, the above complex oxide has a second phase represented by the compositional formula $K_4Nb_6O_{17}$ and/or a third phase represented by the compositional formula $KNb_3O_8$. That is, the above complex oxide may have the second phase and the third phase or any one of the second phase and the third phase, in addition to the first phase.

According to the embodiment, in $KNbO_3$, the void in the piezoelectric composition generated along with volatilization of K is filled utilizing the fact that an excessive Nb, due to the volatilization of K, forms a phase different from the first phase ($KNbO_3$). That is, the presence of two or three phases including the above described first phase in the piezoelectric composition allows the presence of the crystal grains constituting the second phase ($K_4Nb_6O_{17}$) and/or the crystal grains constituting the third phase ($KNb_3O_8$) between the crystal grains constituting the first phase ($KNbO_3$). As a result, voids easily formed between the crystal grains constituting the first phase are filled with the crystal grains constituting the second phase and/or the crystal grains constituting the third phase, and the resistivity of the piezoelectric composition improves.

Further, it is preferable to set the ratio of the second phase and the third phase with respect to the first phase within a specific range. According to the embodiment, when the first phase volume is 100%, the second phase volume is x %, and the third phase volume is y %, "x" and "y" preferably satisfy 0<x+y<10.0, more preferably satisfy 0.1≤x+y≤6.0, and furthermore preferably satisfy 0.2≤x+y≤4.0.

Furthermore, it is preferable that "x" and "y" satisfy x>y. That is, it is preferable that the second phase ($K_4Nb_6O_{17}$) exists more than the third phase ($KNb_3O_8$). It is particularly preferable that the second phase is present in a predetermined ratio and that the third phase is substantially not present. That is, it is particularly preferable to satisfy 0<x<10.0.

By setting the volume ratios of the second phase and the third phase with respect to the volume of the first phase within the above-mentioned range, the voids between the crystal grains constituting the first phase are effectively filled, and the effects described above can be further enhanced.

According to the embodiment, the volumes of the first phase, the second phase, and the third phase are calculated from the peak intensities of the first phase, the second phase, and the third phase, respectively obtained by XRD (X-ray Diffraction) measurement of the piezoelectric composition. Specifically, the maximum peaks indicated by the first phase ($KNbO_3$), the second phase ($K_4Nb_6O_{17}$), and the third phase ($KNb_3O_8$) are identified in the X-ray diffraction chart obtained by XRD measurement, and then the peak intensity $I_1$ of the first phase, the peak intensity $I_2$ of the second phase, and the peak intensity $I_3$ of the third phase are calculated. Then, "x" is calculated from $x=100 \times I_2/I_1$, and "y" is calculated from $y=100 \times I_3/I_1$. When using Cu-Kα radiation as an X-ray source, the maximum peak of the first phase appears around 2θ=31° to 33°, the maximum peak of the second phase appears around 2θ=9° to 11° or 11 to 13°, and the maximum peak of the third phase appears around 2θ=25° to 27°.

Further, the piezoelectric composition according to the embodiment preferably includes one or more selected from transition metal elements (elements of Groups 3 to 11 in the long periodic table) excluding Nb described above. Specifically, examples of transition metal elements other than rare earth elements are chromium (Cr), manganese (Mn), iron (Fe), cobalt (Co), nickel (Ni), copper (Cu), tungsten (W), Molybdenum (Mo) etc. Examples of rare earth elements are yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), etc.

According to the embodiment, copper (Cu) and manganese (Mn) are preferable as the transition metal element. By including the transition metal element, the sinterability of the piezoelectric composition can be improved. As a result, the resistivity of the piezoelectric composition is improved.

The content of the transition metal element in terms of element with respect to 1 mol (100 mol %) of the above complex oxide is preferably 0.1 mol % or more and 3.0 mol % or less, and more preferably 0.1 mol % or more and 1.0 mol % or less.

As long as the transition metal element is included within the above range, the existence form of the transition metal element is not particularly limited. The transition metal element may be solid-solved in the crystal grains constituting the first phase or may exist in grain boundaries. When present in grain boundaries, they may form a compound with other elements, or may form a solid solution in crystal grains constituting the second phase and/or the third phase. However, it is not preferable to exist as a phase different from the first to third phases. By controlling the timing of adding the raw material of the transition metal element in the producing step of the piezoelectric composition described later, the phase including the transition metal element can be prevented from depositing as a phase different from the first phase to the third phase.

Further, although the piezoelectric composition according to the embodiment may include lead (Pb) as an impurity, the content thereof is preferably 1 wt % or less, and Pb is more preferably not included at all. From the viewpoint of a low pollution, an environment resistance and an ecology, it is possible to minimize a volatilization of Pb at the time of firing, or it is possible to minimize the release of Pb into the environment after an electronic apparatus mounting the piezoelectric element including the piezoelectric composition of the embodiment is being distributed to the market and being disposed.

The average crystal grain size of the crystal grains including the piezoelectric composition according to the embodiment may be controlled from the viewpoint of exhibiting piezoelectric properties and mechanical strength. In the embodiment, it is preferable that the average crystal grain size is, for example, 0.5 μm to 20 μm.

2. Producing Method of Piezoelectric Element

Next, an example of a producing method of the piezoelectric element will be described below.

First, a starting material for the piezoelectric composition is prepared. As a starting material for the complex oxide, compounds including K can be used. Examples of the compounds including K are carbonates, hydrogen carbonate compounds, etc. As the compounds including Nb, oxides are exemplified.

According to the embodiment, when weighing the prepared starting materials of the complex oxide, it is preferable to set A/B ratio in $ABO_3$, i.e. the molar ratio of K with respect to Nb, to more than 1.00 and less than 1.20. Thereby, the second phase and/or the third phase tends to be easily formed.

The method of calculating the A/B ratio is not particularly limited as long as it is a ell-known method. For example, it may be calculated from the standard value and the weighed amount of the raw material powder to be used. It may also be calculated by measuring the composition of the weighed raw material powder by an XRF (an X-ray Fluorescence).

When the piezoelectric composition includes a transition metal element, a starting material of the transition metal element is prepared. The starting material of the transition metal element may be a transition metal element or a compound including the transition metal element. According to the embodiment, an oxide including a transition metal element is preferable.

After weighing the starting materials of the prepared complex oxide at a predetermined ratio, mixing is processed for 5 to 20 hours using such as a ball mill. A wet mixing or a dry mixing may be used for the mixing. In the ease of wet mixing, the mixed powder is dried. Subsequently, the mixed powder or a green compact obtained by compacting the mixed powder is subjected to a heat treatment (calcination) in the air at 750 to 1050° C. for 1 to 20 hours to obtain calcined powder of the complex oxide.

According to the embodiment, it is preferable to further add a compound including Nb to the obtained calcined powder in order to adjust the A/B ratio. Preferably, the A/B ratio after the addition of the compound including Nb is greater than 0.90 and less than 1.00. Thereby, the amount of Nb becomes excessive with respect to the amount of K, and the second phase and/or the third phase tends to be easily formed.

The method of calculating the A/B ratio is not particularly limited as long as it is a known method. The desired A/B ratio may be obtained by adding the compound including Nb, after the composition of the calcined powder is measured by such as XRF and the A/B ratio is calculated. The calcined powder to which the compound including Nb may be added and measured by such as XRF.

When the obtained calcined powder is aggregated, it is preferable to pulverize the calcined powder for a predetermined time by using such as a ball mill to obtain pulverized powder. When necessary, starting materials of transition metal elements weighed in a predetermined ratio is added to the calcined powder or pulverized powder with adjusted A/B ratio. The calcined powder or pulverized powder is mixed for 5 to 20 hours using a ball mill etc., and the raw material powder of the piezoelectric composition is obtained. The mixing method may be a wet mixing or a dry mixing. When adopting the wet mixing, the mixed powder is dried to obtain a raw material powder of the piezoelectric composition.

The method for compacting the raw material powder of the piezoelectric composition is not particularly limited, and may be appropriately selected according to a desired shape, size, etc. When performing pressing, a predetermined binder and, if necessary, additives are added to the raw material powder of the piezoelectric composition, and the mixture is formed into a predetermined shape to obtain a green compact. Further, the green compact may be obtained by using a granulated powder obtained by adding such as a predetermined binder to the raw material powder of the piezoelectric composition and granulating thereof. If necessary, the obtained green compact may be subjected to further pressure treatment by such as CIP.

A binder removal treatment is applied to the obtained green compact. As the binder removal condition, the holding temperature is preferably 400° C. to 800° C., and the temperature holding time is preferably 2 hours to 4 hours.

Subsequently, the green compact after the binder removal treatment is heat treated (fired). As the firing conditions, the holding temperature is preferably 950° C. to 1060° C., the temperature holding time is preferably 2 hours to 4 hours, the temperature rising and cooling rate is preferably about 50° C./hour to 300° C./hour, the atmosphere is preferably an oxygen-containing atmosphere.

The obtained piezoelectric composition as a sintered body is polished if necessary, an electrode paste is applied and baked to form an electrode. The method for forming the electrodes is not particularly limited, and electrodes may be formed by a vapor deposition, a sputtering, etc.

An electric field of 2 kV/mm to 5 kV/mm is applied to the sintered body on which the electrode is formed for about 5 minutes to 1 hour in an oil at a predetermined temperature to pole the sintered body. After the poling processing, a piezoelectric composition in which the spontaneous polarization is aligned in a predetermined direction is obtained.

The piezoelectric composition after the poling processing is processed into a predetermined size as necessary to form a plate-shaped piezoelectric part 1. Next, the electrodes 2 and 3 are formed on the piezoelectric part 1 by such as a vapor deposition, whereby the piezoelectric element shown in FIG. 1 is obtained.

3. Effect in the Embodiment

The piezoelectric composition according to the embodiment includes a complex oxide including potassium (K) and niobium (Nb) as a main component. This complex oxide mainly includes a $KNbO_3$ phase (a first phase) having a perovskite structure, and also includes a second phase and/or a third phase different from the first phase according to the embodiment.

Such second and third phases are formed as phases, in which the amount of Nb relative to the amount of K is larger than that of the first phase due to the volatilization of K during firing. The second phase includes $K_4Nb_6O_{17}$ and the third phase includes $KNb_3O_8$.

The second phase and/or the third phase are positioned to fill the voids in the piezoelectric composition due to the volatilization of K. As a result, the voids in the piezoelectric composition can be filled with the second complex oxide and/or the third complex oxide, and the resistivity of the piezoelectric composition can be increased.

A very high DC voltage is applied to the piezoelectric composition after firing by the poling process. Therefore, when resistivity of the piezoelectric composition is low, the leak current increases, the poling process becomes insufficient, and the piezoelectric properties of the piezoelectric composition cannot be exhibited at the maximum.

The piezoelectric composition according to the embodiment has a sufficiently high resistivity, so that even with the application of a high voltage during the poling process, the leakage current is small, and the polarization process can be sufficiently performed. That is, the piezoelectric properties of the piezoelectric composition can be maximally exhibited.

Such effects can be further improved by setting the sum of the volume ratio of the second phase and the volume ratio of the third phase with respect to the volume of the first phase in the piezoelectric composition within a predetermined range.

Moreover, since the sinterability of the piezoelectric composition is improved by including the transition metal element in the piezoelectric composition, the resistivity can be further improved.

4. Modified Embodiments

In the embodiment described above, the piezoelectric element in which the piezoelectric part is a single layer has been described, but a piezoelectric element having a structure in which piezoelectric parts are laminated may be used. Further, a piezoelectric, element having a combination of these may be used.

Figure 2:
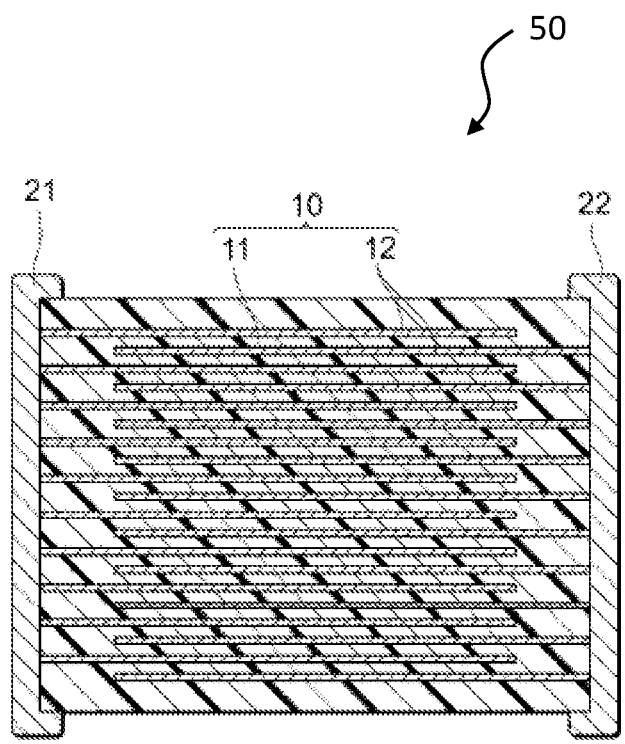
FIG. 2 is a schematic cross sectional view of another example of the piezoelectric element according to the embodiment.

As the piezoelectric element having a structure in which piezoelectric parts are laminated, for example, the piezoelectric element 50 shown in FIG. 2 is exemplified. This piezoelectric element 50 includes a laminate 10 in which multiple piezoelectric layers 11 made of the piezoelectric composition according to the embodiment and multiple internal electrodes 12 are alternately laminated. A pair of terminal electrodes 21 and 22 are formed on both end parts of the laminate 10 to be electrically connected to the internal electrode layers 12 alternately arranged inside the laminate 10.

The thickness per one layer (an interlayer thickness) of the piezoelectric layers 11 is not particularly limited, and can be set arbitrarily according to desired properties, use, etc. Usually, the interlayer thickness is preferably about 1 μm to 100 μm. The number of layers of the piezoelectric layer 11 is not particularly limited, and can be arbitrarily set according to desired properties, use, etc.

As a method of producing the piezoelectric element 50 shown in FIG. 2, a known method may be used. For example, a green chip to be the laminate 10 shown in FIG. 2 is prepared and fired to obtain a laminate 10. Then, terminal electrodes are printed or transferred to the laminate 10 and fired thereof. A general printing method and a sheet method each using paste are exemplified as methods for producing the green chip. In the printing method and the sheet method, a green chip is formed by using a paste prepared by mixing raw material powders of the above described piezoelectric composition and a vehicle in which a binder is dissolved in a solvent and forming a paint.

Although the embodiment of the invention has been described above, the invention is not limited to the above embodiments and modifications may be made in various aspects within a scope of the invention.

EXAMPLE

Hereinafter, the invention will be described in more detail using examples and comparative examples. However, the invention is not limited to the following examples.

First, powder of potassium hydrogen carbonate ($KHCO_3$) and powder of niobium oxide ($Nb_2O_5$) were prepared as starting materials for the complex oxide. Powder of copper oxide (CuO) and powder of manganese oxide ($MnO_2$) were also prepared as starting materials for the transition metal element included in the piezoelectric composition.

The prepared starting material of the complex oxide was weighed so that the ratio had the value shown in the column of A/B (1) in Table 1, and the starting material of the transition metal element was weighed. According to Exs. 1 to 17 and Comp Exs 1, 2 and 4, the weighed powders of $KHCO_3$ and $Nb_2O_5$ were mixed by a ball mill for 16 hours and then dried at 120° C. to obtain a mixed powder. According to Comp Ex 3, the weighed powders of $KHCO_3$, $Nb_2O_5$ and CuO were mixed by a ball mill for 16 hours and then dried at 120° C. to obtain a mixed powder.

The obtained mixed powder was pressed to compact the mixed powder, calcined at 1000° C. for 4 hours, and obtained a calcined powder of the complex oxide. Subsequently, $Nb_2O_5$ was added to this calcined powder so that the A/B ratio thereof becomes a value shown in the column of A/B (2) in Table 1, and the powder was pulverized by a ball mill for 16 hours. Thereby the pulverized powder was obtained.

In Exs. 1 to 11 and Comp Exs 1 to 3, the obtained pulverized powder was used as the raw material powder of the piezoelectric composition. In Examples 12 to 17 and Comp Ex 4, each powder of weighed CuO and $MnO_2$ was added to the obtained pulverized powder, mixed thereof in a ball mill for 3 hours, and then dried thereof at 100° C. and obtained the raw material powder of the piezoelectric composition.

PVA as a binder was added to the raw material powder of the obtained piezoelectric composition and granulated thereof by a well-known method. Next, the obtained granulated powder was pressed by a pressing machine under a load of 5.0 MPa and obtained a plate-shaped green compact.

The plate-shaped green compact thus obtained was subjected to a binder removal treatment at 550° C. for 3 hours. The green compact after the binder removal treatment was fired under air at 1050° C. for 3 hours and obtained a piezoelectric composition (a sintered body).

The obtained sintered body was polished to obtain a parallel plate shape having a thickness of 1.0 mm, silver paste was printed on both sides of the parallel plate shaped sintered body, baked thereof at 600° C. and provided facing electrodes of silver. And piezoelectric composition samples (Examples 1 to 17 and Comparative Examples 1 to 4) before the poling process were obtained.

The volume ratios of the second phase and the third phase with respect to the first phase of the obtained sample and the resistivity thereof were measured as follows.

The volume ratios of the second phase and the third phase with respect to the first phase were calculated from the peak intensities of the observed first phase, the second phase and the third phase obtained by an XRD measurement on the sample. For the XRD measurement, an X-ray diffractometer (SmartLab made by RIGAKU Co., Ltd.) using a Cu-Kα ray as an X-ray source was used. The measurement conditions were a voltage of 45 kV, an electric current of 200 mA, and a scanning speed of 40 deg/min in the range of 2θ=0 to 40°.

Figure 3:
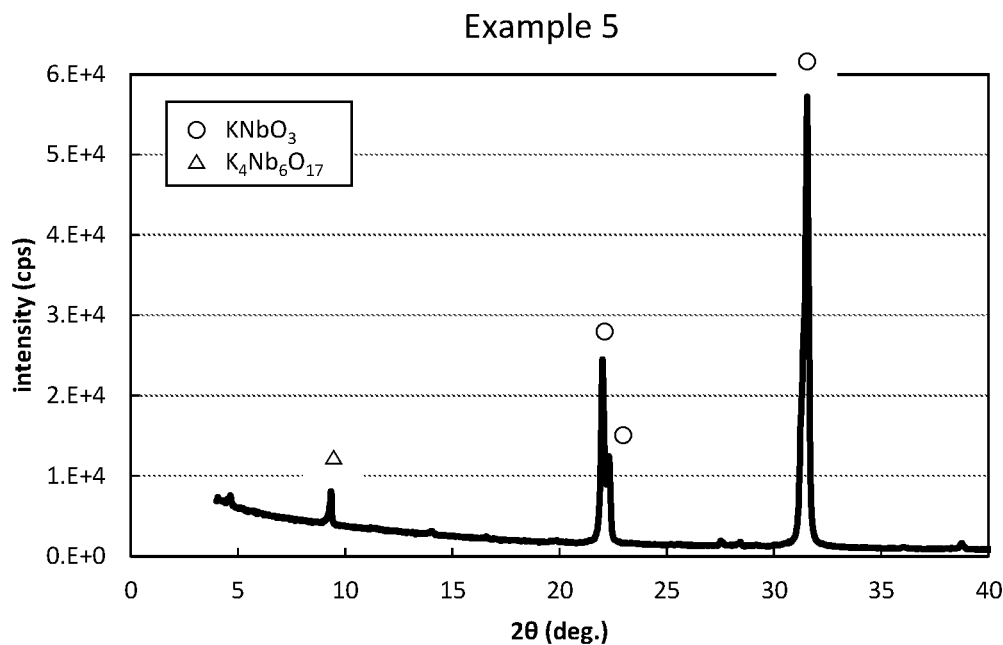
FIG. 3(a) is an X-ray diffraction chart of a sample according to an example of the invention.
FIG. 3(b) is an X-ray diffraction chart of a sample according to a comparative example of the invention.
Figure 3:
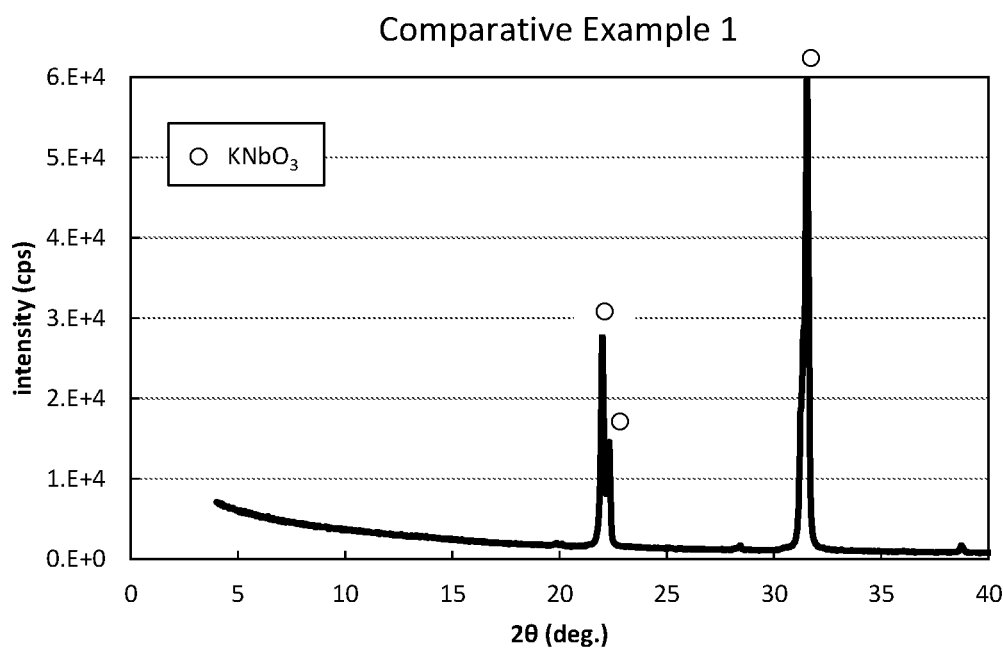

The largest peak among the peaks belonging to the first phase ($KNbO_3$), the largest peak among the peaks belonging to the second phase ($K_4Nb_6O_{17}$), and the largest peak among the peaks belonging to the third phase ($KNb_3O_8$) were identified from the X-ray diffraction chart obtained by the measurement, and the maximum peak intensities ($I_1$, $I_2$, $I_3$) of each were calculated. Each peak intensity was calculated by subtracting the background value from the measured value. X-ray diffraction charts of the samples of Example 5 and Comparative Example 1 are shown in FIG. 3. It was confirmed from FIG. 3(a) that the second phase exists in addition to the first phase in the samples of Example 5. On the other hand, in the sample of Comparative Example 1, it was confirmed from FIG. 3(b) that only the first phase exists in the samples of Comparative Example 1.

From the calculated intensities, the followings were calculated using the equation shown below. Ratio of the maximum peak intensity of the second phase with respect to the maximum peak intensity of the first phase was calculated as the ratio (x) of the volume of the second phase with respect to the volume of the first phase. Ratio of the maximum peak intensity of the third phase with respect to the maximum peak intensity of the first phase was calculated as the ratio (y) of the volume of the third phase with respect to the volume of the first phase. The results are shown in Table 1.

$$x\ (\%) = 100 I_2/I_1$$

$$y\ (\%) = 100 I_3/I_1$$

In addition, the resistivity was calculated from the insulation resistance value measured when a DC voltage of 50V is applied to the sintered body on which the electrode is formed, using an ultra-high resistance meter (ULTRA HIGH RESISTANCE METER R8340 made by ADVANTEST). The insulation resistance value was a value measured 10 seconds after the application of the DC voltage. From the obtained insulation resistance value, the resistivity ρ (Ω·cm) was calculated using the following equation.

$$\rho = RS/l$$

Here, R is an insulation resistance (Ω), S is an electrode area ($cm^2$), and l is a distance between electrodes (cm). In this example, it was determined that a sample having a resistivity of $1.00 \times 10^8$ Ω·cm or more was preferable. The results are shown in Table 1. Note that the notation "aE+b" in the column of "resistivity ρ" in Table 1 indicates "$a \times 10^b$".

TABLE 1

| | Piezoelectric Composition | | | | | | | | |
|---|---|---|---|---|---|---|---|---|---|
| | | Second Phase: | Third Phase: | | Transition Metals | | Before | Before | Property |
| Sample No. | First Phase | $K_4Nb_6O_{17}$ x (%) | $KNb_3O_8$ y (%) | x + y (%) | Kind of Elements | Content (mol %) | Calcination A/B (1) | Firing A/B (2) | Resistivity: ρ (Ω · cm) |
| Ex. 1 | $KNbO_3$ | 0.0 | 10.9 | 10.9 | — | — | 1.010 | 0.900 | 2.10E+09 |
| Ex. 2 | $KNbO_3$ | 10.5 | 0.0 | 10.5 | — | — | 1.010 | 0.995 | 3.40E+09 |
| Ex. 3 | $KNbO_3$ | 6.5 | 5.1 | 11.6 | — | — | 1.010 | 0.950 | 1.50E+09 |
| Ex. 4 | $KNbO_3$ | 0.0 | 8.9 | 8.9 | — | — | 1.008 | 0.900 | 4.00E+10 |

TABLE 1-continued

| | | Piezoelectric Composition | | | | | | | |
|---|---|---|---|---|---|---|---|---|---|
| | | Second Phase: | Third Phase: | | Transition Metals | | Before | Before | Property |
| Sample No. | First Phase | $K_4Nb_6O_{17}$ x (%) | $KNb_3O_8$ y (%) | x + y (%) | Kind of Elements | Content (mol %) | Calcination A/B (1) | Firing A/B (2) | Resistivity: $\rho$ ($\Omega \cdot cm$) |
| Ex. 5 | $KNbO_3$ | 9.6 | 0.0 | 9.6 | — | — | 1.008 | 0.995 | 7.80E+10 |
| Ex. 6 | $KNbO_3$ | 1.8 | 2.5 | 4.3 | — | — | 1.005 | 0.950 | 1.80E+11 |
| Ex. 7 | $KNbO_3$ | 4.5 | 5.2 | 9.7 | — | — | 1.008 | 0.950 | 8.30E+10 |
| Ex. 8 | $KNbO_3$ | 4.1 | 3.5 | 7.6 | — | — | 1.005 | 0.980 | 4.30E+11 |
| Ex. 9 | $KNbO_3$ | 1.0 | 0.6 | 1.6 | — | — | 1.005 | 0.995 | 7.20E+11 |
| Ex. 10 | $KNbO_3$ | 7.2 | 1.2 | 8.4 | — | — | 1.008 | 0.980 | 3.00E+11 |
| Ex. 11 | $KNbO_3$ | 0.2 | 0.1 | 0.3 | — | — | 1.002 | 0.980 | 6.70E+11 |
| Ex. 12 | $KNbO_3$ | 0.6 | 0.9 | 1.5 | Cu | 0.10 | 1.002 | 0.995 | 5.80E+12 |
| Ex. 13 | $KNbO_3$ | 1.1 | 0.7 | 1.8 | Cu | 1.00 | 1.002 | 0.995 | 4.30E+12 |
| Ex. 14 | $KNbO_3$ | 1.3 | 1.2 | 2.5 | Cu | 3.00 | 1.002 | 0.995 | 3.00E+12 |
| Ex. 15 | $KNbO_3$ | 0.9 | 1.8 | 2.7 | Mn | 0.10 | 1.002 | 0.995 | 8.90E+11 |
| Ex. 16 | $KNbO_3$ | 1.2 | 1.6 | 2.8 | Mn | 1.00 | 1.002 | 0.995 | 1.30E+12 |
| Ex. 17 | $KNbO_3$ | 0.8 | 1.7 | 2.5 | Mn | 3.00 | 1.002 | 0.995 | 9.20E+11 |
| Comp. Ex. 1 | $KNbO_3$ | 0.0 | 0.0 | 0.0 | — | — | 1.020 | 1.050 | 6.80E+07 |
| Comp. Ex. 2 | $KNbO_3$ | 0.0 | 0.0 | 0.0 | — | — | 1.000 | 1.000 | 3.20E+07 |
| Comp. Ex. 3 | $KNbO_3$ | 0.0 | 0.0 | 0.0 | Cu | 0.10 | 1.010 | 0.900 | 7.80E+07 |
| Comp. Ex. 4 | $KNbO_3$ | 0.0 | 0.0 | 0.0 | Cu | 0.10 | 0.900 | 0.900 | 6.50E+07 |

The notation "aE + b" in the "resistivity $\rho$" column indicates "a × $10^b$".

From Table 1, it was confirmed that the existence of the second phase and/or the third phase can provide a good resistivity. In addition, it was confirmed that a high resistivity can be obtained by setting the sum of the volume ratio of the second phase and the volume ratio of the third phase with respect to the volume of the first phase within the above-described range.

Furthermore, it was confirmed that a very high resistivity can be obtained when the piezoelectric composition includes transition metal elements (Cu and Mn).

Since the piezoelectric composition of the invention has a high resistivity, it can be sufficiently subjected to poling process, and can be suitably used for the piezoelectric elements in various fields.

DESCRIPTION OF REFERENCE NUMERAL

5 . . . Piezoelectric element
1 . . . Piezoelectric part
2, 3 . . . Electrodes
50 . . . Piezoelectric element
10 . . . Laminate
11 . . . Piezoelectric layer
12 . . . Internal electrode layer
21, 22 . . . terminal electrodes

What is claimed is:

1. A piezoelectric composition comprising a complex oxide including potassium and niobium as a main component, wherein the complex oxide comprises:
 a first phase represented by a compositional formula $KNbO_3$; and
 one or two phases selected from a second phase represented by a compositional formula $K_4Nb_6O_{17}$ and a third phase represented by a compositional formula $KNb_3O_8$.

2. The piezoelectric composition according to claim 1, wherein x and y satisfy 0<x+y<10.0%, when a volume of the second phase and a volume of the third phase with respect to a volume of the first phase are x % and y %, respectively.

3. The piezoelectric composition according to claim 2, wherein x and y satisfy x>y.

4. The piezoelectric composition according to claim 1, wherein the piezoelectric composition includes one or more transition metal elements.

5. A piezoelectric element including the piezoelectric composition according to claim 1.

6. The piezoelectric composition according to claim 2, wherein the piezoelectric composition includes one or more transition metal elements.

7. The piezoelectric composition according to claim 3, wherein the piezoelectric composition includes one or more transition metal elements.

8. A piezoelectric element including the piezoelectric composition according to claim 2.

9. A piezoelectric element including the piezoelectric composition according to claim 3.

10. A piezoelectric element including the piezoelectric composition according to claim 4.

11. A piezoelectric element including the piezoelectric composition according to claim 6.

12. A piezoelectric element including the piezoelectric composition according to claim 7.

* * * * *